United States Patent
Wakabayashi et al.

(10) Patent No.: US 11,614,572 B2
(45) Date of Patent: Mar. 28, 2023

(54) MIRROR FOR EXTREME ULTRAVIOLET LIGHT AND EXTREME ULTRAVIOLET LIGHT GENERATING APPARATUS

(71) Applicant: Gigaphoton Inc., Tochigi (JP)

(72) Inventors: Osamu Wakabayashi, Oyama (JP); Yoshiyuki Honda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 407 days.

(21) Appl. No.: 16/814,384

(22) Filed: Mar. 10, 2020

(65) Prior Publication Data

US 2020/0209444 A1    Jul. 2, 2020

Related U.S. Application Data

(63) Continuation of application No. PCT/JP2017/037995, filed on Oct. 20, 2017.

(51) Int. Cl.
| | |
|---|---|
| *G02B 5/08* | (2006.01) |
| *G03F 1/24* | (2012.01) |
| *G03F 1/52* | (2012.01) |
| *G03F 1/58* | (2012.01) |
| *G21K 1/06* | (2006.01) |

(52) U.S. Cl.
CPC .............. *G02B 5/0891* (2013.01); *G03F 1/24* (2013.01); *G03F 1/52* (2013.01); *G03F 1/58* (2013.01); *G21K 1/062* (2013.01)

(58) Field of Classification Search
CPC ........ H05G 2/005; H05G 2/008; G21K 1/062; G03F 1/24; G03F 1/52; G03F 1/58; G03F 7/20; G03F 7/70033; G03F 7/70175; G03F 7/70958; G02B 5/0891; G02B 5/0833
See application file for complete search history.

(56) References Cited

U.S. PATENT DOCUMENTS

| | | | |
|---|---|---|---|
| 2004/0150096 A1* | 8/2004 | Purushothaman | .. H01L 23/3164 257/E21.705 |
| 2007/0170378 A1 | 7/2007 | Bowering et al. | |
| 2012/0196208 A1* | 8/2012 | Mikami | ............ G03F 7/70958 430/4 |
| 2014/0098413 A1 | 4/2014 | Ershov et al. | |
| 2016/0349412 A1 | 12/2016 | Bowering | |

(Continued)

FOREIGN PATENT DOCUMENTS

| | | |
|---|---|---|
| JP | 2004-363570 A | 12/2004 |
| JP | 2006-170911 A | 6/2006 |

(Continued)

OTHER PUBLICATIONS

Machine translation of JP 2006170916.*

(Continued)

*Primary Examiner* — Deoram Persaud
(74) *Attorney, Agent, or Firm* — Studebaker & Brackett PC

(57) ABSTRACT

A mirror for extreme ultraviolet light includes: a substrate (41); a multilayer film (42) provided on the substrate and configured to reflect extreme ultraviolet light; and a capping layer (53) provided on the multilayer film, and the capping layer includes a first layer (61) containing an oxide of a metal, and a second layer (62) arranged between the first layer and the multilayer film and containing at least one of a boride of the metal and a nitride of the metal.

18 Claims, 7 Drawing Sheets

(56) References Cited

U.S. PATENT DOCUMENTS

2020/0209755 A1* 7/2020 Honda .................. G03F 7/2008
2020/0209759 A1* 7/2020 Wakabayashi ...... G03F 7/70958
2021/0341828 A1* 11/2021 Liu ........................... G03F 1/60

FOREIGN PATENT DOCUMENTS

| JP | 2006-170916 A | 6/2006 |
| JP | 2007-528608 A | 10/2007 |
| JP | 2014-116498 A | 6/2014 |
| JP | 2015-533253 A | 11/2015 |

OTHER PUBLICATIONS

International Search Report issued in PCT/JP2017/037995; dated Jan. 9, 2018.
Written Opinion issued in PCT/JP2017/037995; dated Jan. 9, 2018.

* cited by examiner

MIRROR FOR EXTREME ULTRAVIOLET LIGHT AND EXTREME ULTRAVIOLET LIGHT GENERATING APPARATUS

CROSS-REFERENCE TO RELATED APPLICATIONS

The present application is a continuation application of International Application No. PCT/JP2017/037995, filed on Oct. 20, 2017, the entire contents of which are hereby incorporated by reference.

BACKGROUND

1. Technical Field

The present disclosure relates to a mirror for extreme ultraviolet light and an extreme ultraviolet light generating apparatus.

2. Related Art

Recently, miniaturization of semiconductor processes has involved increasing miniaturization of transfer patterns for use in photolithography of the semiconductor processes. In the next generation, microfabrication at 20 nm or less will be required. Thus, development of an exposure device is expected including a combination of an apparatus for generating extreme ultraviolet (EUV) light having a wavelength of about 13 nm and reduced projection reflection optics.

Three types of extreme ultraviolet light generating apparatuses have been proposed: an LPP (Laser Produced Plasma) type apparatus using plasma generated by irradiating a target substance with a laser beam, a DPP (Discharge Produced Plasma) type apparatus using plasma generated by discharge, and an SR (Synchrotron Radiation) type apparatus using synchrotron radiation light.

LIST OF DOCUMENTS

Patent Documents

Patent Document 1: Japanese Unexamined Patent Application Publication No. 2004-363570
Patent Document 2: Japanese Unexamined Patent Application Publication No. 2014-116498
Patent Document 3: US Published Patent Application No. 2016/0349412

SUMMARY

A mirror for extreme ultraviolet light according to one aspect of the present disclosure may include: a substrate; a multilayer film provided on the substrate and configured to reflect extreme ultraviolet light; and a capping layer provided on the multilayer film. The capping layer may include a first layer containing an oxide of a metal, and a second layer arranged between the first layer and the multilayer film and containing at least one of a boride of the metal and a nitride of the metal.

An extreme ultraviolet light generating apparatus according to one aspect of the present disclosure may include: a chamber; a droplet discharge unit configured to discharge a droplet of a target substance into the chamber; and a mirror for extreme ultraviolet light provided in the chamber. The mirror for extreme ultraviolet light may include a substrate, a multilayer film provided on the substrate and configured to reflect extreme ultraviolet light, and a capping layer provided on the multilayer film. The capping layer may include a first layer containing an oxide of a metal, and a second layer arranged between the first layer and the multilayer film and containing at least one of a boride of the metal and a nitride of the metal.

BRIEF DESCRIPTION OF THE DRAWINGS

With reference to the accompanying drawings, some embodiments of the present disclosure will be described below merely by way of example.

DESCRIPTION OF EMBODIMENTS

Figure 1:
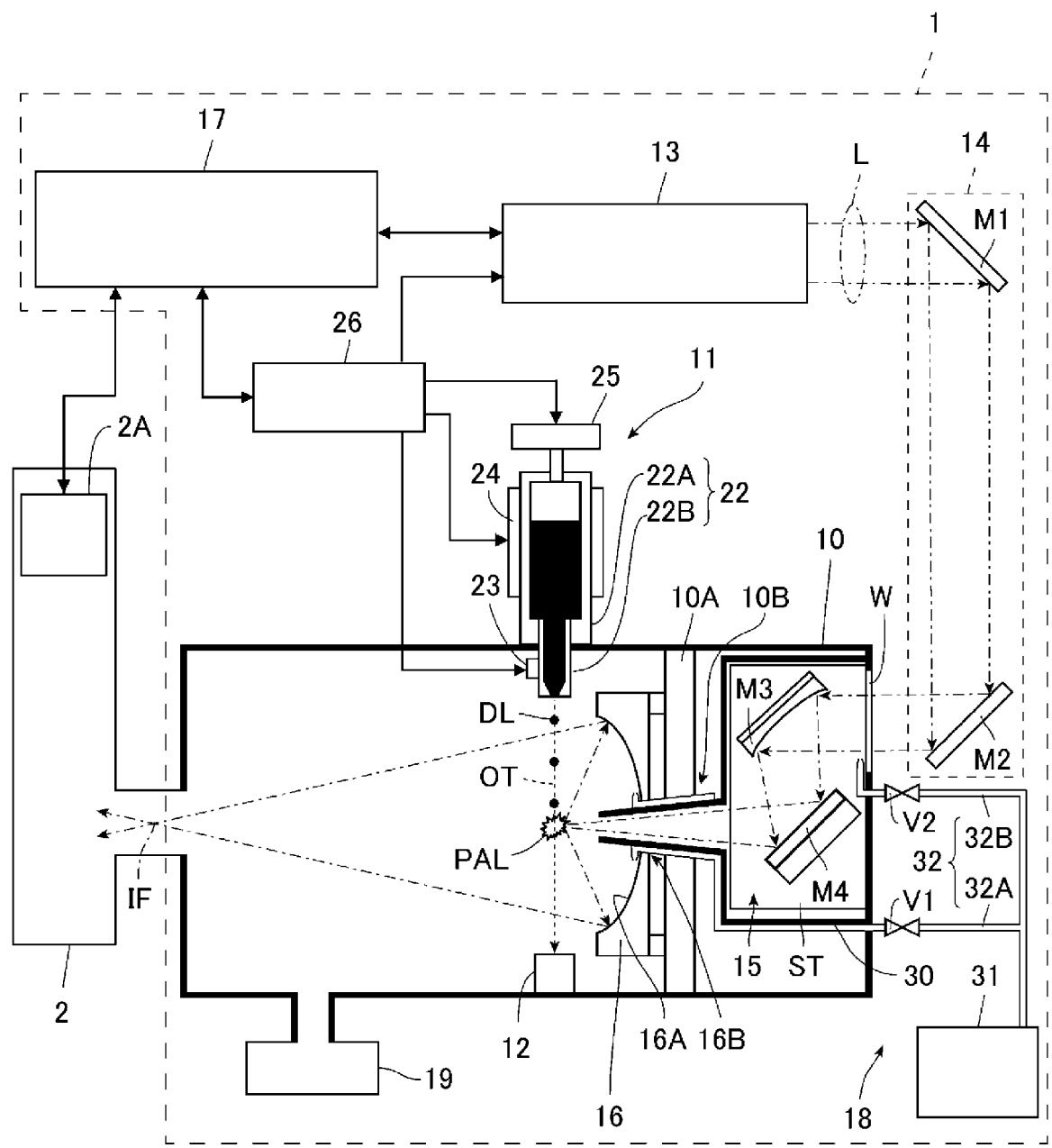
FIG. 1 diagrammatically shows a schematic exemplary configuration of an entire extreme ultraviolet light generating apparatus.

1. Overview
2. Description of extreme ultraviolet light generating apparatus
   2.1 Overall configuration
   2.2 Operation
3. Description of EUV light reflective mirror of comparative example
   3.1 Configuration
   3.2 Problem
4. Description of EUV light reflective mirror of Embodiment 1
   4.1 Configuration
   4.2 Effect
5. Description of EUV light reflective mirror of Embodiment 2
   5.1 Configuration
   5.2 Effect Now, with reference to the drawings, embodiments of the present disclosure will be described in detail.

The embodiments described below illustrate some examples of the present disclosure, and do not limit contents of the present disclosure. Also, all configurations and operations described in the embodiments are not necessarily essential as configurations and operations of the present disclosure.

The same components are denoted by the same reference numerals, and overlapping descriptions are omitted.

1. Overview

Embodiments of the present disclosure relate to a mirror used in an extreme ultraviolet light generating apparatus configured to generate light having a wavelength of extreme ultraviolet (EUV) light. Hereinafter, the extreme ultraviolet light is sometimes referred to as EUV light.

2. Description of Extreme Ultraviolet Light Generating Apparatus 2.1 Overall Configuration FIG. 1 diagrammatically shows a schematic exemplary configuration of an entire extreme ultraviolet light generating apparatus. As shown in FIG. 1, an extreme ultraviolet light generating apparatus 1 of this embodiment is used together with an exposure device 2. The exposure device 2 exposes a semiconductor wafer to EUV light generated by the extreme ultraviolet light generating apparatus 1, and includes a control unit 2A. The control unit 2A outputs a burst signal to the extreme ultraviolet light generating apparatus 1. The burst signal designates a burst period for generating the EUV light and an intermission period for stopping generation of the EUV light. For example, a burst signal to alternately repeat the burst period and the intermission period is output from the control unit 2A of the exposure device 2 to the extreme ultraviolet light generating apparatus 1.

The extreme ultraviolet light generating apparatus 1 includes a chamber 10. The chamber 10 is a container that can be sealed and reduced in pressure. A wall of the chamber 10 has at least one through-hole. The through-hole is closed by a window W. The window W is configured to transmit a laser beam L entering from outside the chamber 10. The chamber 10 may be divided by a partition plate 10A.

The extreme ultraviolet light generating apparatus 1 also includes a droplet discharge unit 11. The droplet discharge unit 11 is configured to discharge a droplet DL of a target substance into the chamber 10. The droplet discharge unit 11 may include, for example, a target ejector 22, a piezoelectric element 23, a heater 24, a pressure adjusting unit 25, and a droplet generation control unit 26.

The target ejector 22 includes a tank 22A removably mounted to the wall of the chamber 10, and a nozzle 22B connected to the tank 22A. The tank 22A stores the target substance. A material of the target substance may include tin, terbium, gadolinium, lithium, or xenon, or any combinations of two or more of them, but not limited thereto. At least a tip of the nozzle 22B is arranged in the chamber 10.

The piezoelectric element 23 is provided on an outer surface of the nozzle 22B of the target ejector 22. The piezoelectric element 23 is driven by power supplied from the droplet generation control unit 26, and vibrates at predetermined vibration intervals. The heater 24 is provided on an outer surface of the tank 22A of the target ejector 22. The heater 24 is driven by the power supplied from the droplet generation control unit 26, and heats the tank 22A of the target ejector 22 so as to reach a preset temperature. The preset temperature may be set by the droplet generation control unit 26, or by an input device outside the extreme ultraviolet light generating apparatus 1. The pressure adjusting unit 25 adjusts a gas supplied from a gas cylinder (not shown) to gas pressure designated by the droplet generation control unit 26. The gas at the gas pressure presses the molten target substance stored in the tank 22A of the target ejector 22.

A droplet-related signal is input to the droplet generation control unit 26. The droplet-related signal indicates information relating to the droplet DL such as a speed or a direction of the droplet DL. The droplet generation control unit 26 controls the target ejector 22 to adjust a discharge direction of the droplet DL based on the droplet-related signal. The droplet generation control unit 26 controls the pressure adjusting unit 25 to adjust the speed of the droplet DL based on the droplet-related signal. The control of the droplet generation control unit 26 is merely exemplary, and different control may be added as required.

The extreme ultraviolet light generating apparatus 1 further includes a droplet collecting unit 12. The droplet collecting unit 12 is configured to collect a droplet DL that has not been turned into plasma in the chamber 10 among droplets DL supplied into the chamber 10. For example, the droplet collecting unit 12 is provided on a trajectory OT of the droplet DL on a wall of the chamber 10 opposite to a wall to which the droplet discharge unit 11 is mounted.

The extreme ultraviolet light generating apparatus 1 further includes a laser unit 13, a beam transmission optical system 14, a laser beam condensing optical system 15, and an EUV light reflective mirror 16. The laser unit 13 emits a laser beam L having a predetermined pulse width. The laser unit 13 includes, for example, a solid-state laser or a gas laser. The solid-state laser includes, for example, an Nd:YAG laser, an Nd:YVO$_4$ laser, or a laser that outputs harmonic light thereof. The gas laser includes, for example, a $CO_2$ laser or an excimer laser.

The beam transmission optical system 14 is configured to transmit the laser beam L emitted from the laser unit 13 to the window W of the chamber 10. The beam transmission optical system 14 may include, for example, a plurality of mirrors M1, M2 configured to reflect the laser beam L. In the example in FIG. 1, two mirrors are provided, but one mirror or three or more mirrors may be provided. An optical element other than the mirror such as a beam splitter may be used.

The laser beam condensing optical system 15 is provided in the chamber 10 and is configured to focus, in a plasma generating region PAL, the laser beam L having entered the chamber 10 through the window W. In the plasma generating region PAL, the droplet DL is turned into plasma. The laser beam condensing optical system 15 may include, for example, a concave mirror M3 configured to reflect the laser beam L having entered the chamber 10 and to focus and guide the laser beam L in a reflecting direction, and a mirror M4 configured to reflect the laser beam L from the concave mirror M3 toward the plasma generating region PAL. The laser beam condensing optical system 15 may include a stage ST movable in three axial directions, and the stage ST may be moved to adjust a focusing position.

The EUV light reflective mirror 16 is a mirror for EUV light provided in the chamber 10 and configured to reflect EUV light generated when the droplet DL is turned into plasma in the plasma generating region PAL in the chamber 10. The EUV light reflective mirror 16 includes, for example, a spheroidal reflective surface that reflects the EUV light generated in the plasma generating region PAL, and is configured so that a first focal point is located in the plasma generating region PAL and a second focal point is located in an intermediate focal point IF. The EUV light reflective mirror 16 may have a through-hole 16B extending from a surface 16A that reflects the EUV light to a surface opposite to the surface 16A and including a central axis of the EUV light reflective mirror 16. The laser beam L emitted from the laser beam condensing optical system 15 may pass through the through-hole 16B. The central axis of the EUV light reflective mirror 16 may be a line passing through the first focal point and the second focal point or may be a rotation axis of a spheroid. When the chamber 10 is divided by the partition plate 10A as described above, the EUV light reflective mirror 16 may be secured to the partition plate 10A. In this case, the partition plate 10A may have a communication hole 10B communicating with the through-hole 16B in the EUV light reflective mirror 16. The EUV light reflective mirror 16 may include a temperature adjustor to maintain the EUV light reflective mirror 16 at a substantially constant temperature.

The extreme ultraviolet light generating apparatus 1 further includes an EUV light generation controller 17. The EUV light generation controller 17 generates the droplet-related signal based on a signal output from a sensor (not shown), and outputs the generated droplet-related signal to the droplet generation control unit 26 of the droplet discharge unit 11. The EUV light generation controller 17 also generates a light emission trigger signal based on the droplet-related signal and the burst signal output from the exposure device 2, and outputs the generated light emission trigger signal to the laser unit 13, thereby controlling a burst operation of the laser unit 13. The burst operation means an operation of emitting a continuous pulse laser beam L at predetermined intervals during a burst-on period and suppressing emission of the laser beam L during a burst-off period. The control of the EUV light generation controller 17 is merely exemplary, and different control may be added as required. The EUV light generation controller 17 may perform the control of the droplet generation control unit 26.

The extreme ultraviolet light generating apparatus 1 further includes a gas supply unit 18. The gas supply unit 18 is configured to supply a gas, which reacts with fine particles generated when the droplet DL is turned into plasma, into the chamber 10. The fine particles include neutral particles and charged particles. When the material of the target substance stored in the tank 22A of the droplet discharge unit 11 is tin, the gas supplied from the gas supply unit 18 is a hydrogen gas or a gas containing hydrogen. In this case, tin fine particles are generated when the droplet DL of the target substance is turned into plasma, and the tin fine particles react with the hydrogen to generate stannane that is gas at room temperature. The gas supply unit 18 may include, for example, a cover 30, a gas storing unit 31, and a gas introducing pipe 32.

In the example in FIG. 1, the cover 30 is provided to cover the laser beam condensing optical system 15, and includes a truncated conical nozzle. The nozzle of the cover 30 is inserted through the through-hole 16B in the EUV light reflective mirror 16, and a tip of the nozzle protrudes from the surface 16A of the EUV light reflective mirror 16 and is directed toward the plasma generating region PAL. The gas storing unit 31 stores the gas that reacts with the fine particles generated when the droplet DL is turned into plasma. The gas introducing pipe 32 introduces the gas stored in the gas storing unit 31 into the chamber 10. As in the example in FIG. 1, the gas introducing pipe 32 may be divided into a first gas introducing pipe 32A and a second gas introducing pipe 32B.

In the example in FIG. 1, the first gas introducing pipe 32A is configured to adjust, with a flow regulating valve V1, a flow rate of the gas flowing from the gas storing unit 31 through the first gas introducing pipe 32A. In the example in FIG. 1, an output end of the first gas introducing pipe 32A is arranged along an outer wall surface of the nozzle of the cover 30 inserted through the through-hole 16B in the EUV light reflective mirror 16, and an opening of the output end is directed toward the surface 16A of the EUV light reflective mirror 16. Thus, the gas supply unit 18 can supply the gas along the surface 16A of the EUV light reflective mirror 16 toward an outer edge of the EUV light reflective mirror 16. In the example in FIG. 1, the second gas introducing pipe 32B is configured to adjust, with a flow regulating valve V2, a flow rate of the gas flowing from the gas storing unit 31 through the second gas introducing pipe 32B. In the example in FIG. 1, an output end of the second gas introducing pipe 32B is arranged in the cover 30, and an opening of the output end is directed toward an inner surface of the window W of the chamber 10. Thus, the gas supply unit 18 can introduce the gas along an inner surface of the chamber 10 at the window W, and supply the gas from the nozzle of the cover 30 toward the plasma generating region PAL.

The extreme ultraviolet light generating apparatus 1 further includes an exhaust unit 19. The exhaust unit 19 is configured to exhaust a residual gas in the chamber 10. The residual gas contains the fine particles generated when the droplet DL is turned into plasma, a product generated by the reaction between the fine particles and the gas supplied from the gas supply unit 18, and an unreacted gas. The exhaust unit 19 may maintain the inside of the chamber 10 at substantially constant pressure.

2.2 Operation

The gas supply unit 18 supplies, into the chamber 10, the gas that reacts with the fine particles generated when the droplet DL is turned into plasma. The exhaust unit 19 maintains the inside of the chamber 10 at substantially constant pressure. The pressure in the chamber 10 is, for example, within the range of 20 to 100 Pa, preferably 15 to 40 Pa.

In this state, the EUV light generation controller 17 controls the droplet discharge unit 11 to discharge the droplet DL of the target substance into the chamber 10, and controls the laser unit 13 to perform the burst operation. A diameter of the droplet DL supplied from the droplet discharge unit 11 to the plasma generating region PAL is, for example, 10 to 30 μm.

The laser beam L emitted from the laser unit 13 is transmitted to the window W of the chamber 10 by the beam transmission optical system 14, and enters the chamber 10 through the window W. The laser beam L having entered the chamber 10 is focused in the plasma generating region PAL by the laser beam condensing optical system 15, and is applied to at least one droplet DL having reached the plasma generating region PAL from the droplet discharge unit 11. The droplet DL irradiated with the laser beam L is turned into plasma, and light including EUV light is radiated from the plasma. The EUV light is selectively reflected by the reflective surface of the EUV light reflective mirror 16 and is emitted to the exposure device 2. A plurality of laser beams may be applied to one droplet DL.

When the droplet DL is turned into plasma to generate the fine particles as described above, the fine particles are dispersed in the chamber 10. One part of the fine particles dispersed in the chamber 10 move toward the nozzle of the cover 30 of the gas supply unit 18. When the gas introduced from the second gas introducing pipe 32B of the gas supply unit 18 moves from the nozzle of the cover 30 toward the plasma generating region PAL as described above, the fine particles dispersed in the plasma generating region PAL can be suppressed from entering the cover 30. Even if the fine particles enter the cover 30, the gas introduced from the second gas introducing pipe 32B reacts with the fine particles, thereby suppressing the fine particles from adhering to the window W, the concave mirror M3, the mirror M4, or the like.

Another part of the fine particles dispersed in the chamber 10 move toward the surface 16A of the EUV light reflective mirror 16. The fine particles moving toward the surface 16A of the EUV light reflective mirror 16 react with the gas supplied from the gas supply unit 18 to generate a predetermined product. As described above, when the gas supply unit 18 supplies the gas along the surface 16A of the EUV light reflective mirror 16, the gas and the fine particles can more efficiently react with each other than when no gas is supplied along the surface 16A.

When the material of the target substance is tin and the gas supplied from the gas supply unit 18 contains hydrogen as described above, the tin fine particles react with the hydrogen to generate stannane that is gas at room temperature. However, stannane is easily dissociated from hydrogen at high temperature to generate tin fine particles. Thus, when the product is stannane, the EUV light reflective mirror 16 is preferably maintained at a temperature of 60° C. or lower to suppress dissociation from hydrogen. The temperature of the EUV light reflective mirror 16 is more preferably 20° C. or lower.

The product obtained by the reaction with the gas supplied from the gas supply unit 18, together with an unreacted gas, flows in the chamber 10. At least part of the product and the unreacted gas flowing in the chamber 10 flow, as a residual gas, into the exhaust unit 19 on an exhaust flow of the exhaust unit 19. The residual gas having flowed into the exhaust unit 19 is subjected to a predetermined exhaust process such as detoxification in the exhaust unit 19. This suppresses the fine particles or the like generated when the droplet DL is turned into plasma from accumulating on the surface 16A of the EUV light reflective mirror 16 or the like. This also suppresses the fine particles or the like from remaining in the chamber 10.

3. Description of EUV Light Reflective Mirror of Comparative Example

Next, an EUV light reflective mirror of a comparative example of the extreme ultraviolet light generating apparatus will be described. Components similar to those described above are denoted by the same reference numerals, and overlapping descriptions are omitted unless otherwise stated.

3.1 Configuration

Figure 2:
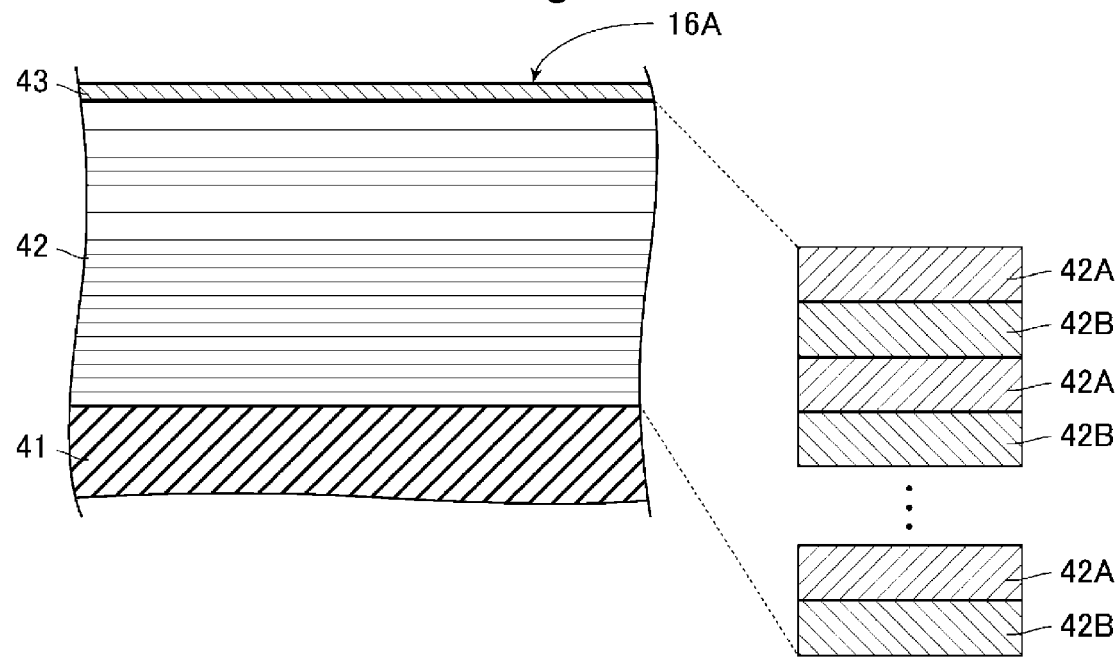
FIG. 2 diagrammatically shows a section of an EUV light reflective mirror of a comparative example.

FIG. 2 diagrammatically shows a section of an EUV light reflective mirror 16 of a comparative example. As shown in FIG. 2, the EUV light reflective mirror 16 of the comparative example includes a substrate 41, a multilayer film 42, and a capping layer 43.

The multilayer film 42 reflects EUV light and is provided on the substrate 41. The multilayer film 42 includes a first layer 42A containing a first material and a second layer 42B containing a second material alternately stacked. A reflective surface of the EUV light reflective mirror 16 includes an interface between the first layer 42A and the second layer 42B of the multilayer film 42, and a surface of the multilayer film 42. The surface of the multilayer film 42 is an interface between the multilayer film 42 and the capping layer 43. As long as the multilayer film 42 reflects the EUV light, the first material and the second material are not limited. For example, the first material may be Mo and the second material may be Si, or the first material may be Ru and the second material may be Si. Alternatively, for example, the first material may be Be and the second material may be Si, or the first material may be Nb and the second material may be Si. Alternatively, for example, the first material may be Mo and the second material may be RbSiH$_3$, or the first material may be Mo and the second material may be Rb$_x$Si$_y$.

The capping layer 43 protects the multilayer film 42. A material of the capping layer 43 is, for example, TiO$_2$. The material of the capping layer 43 may be other than TiO$_2$.

3.2 Problem

Figure 3:
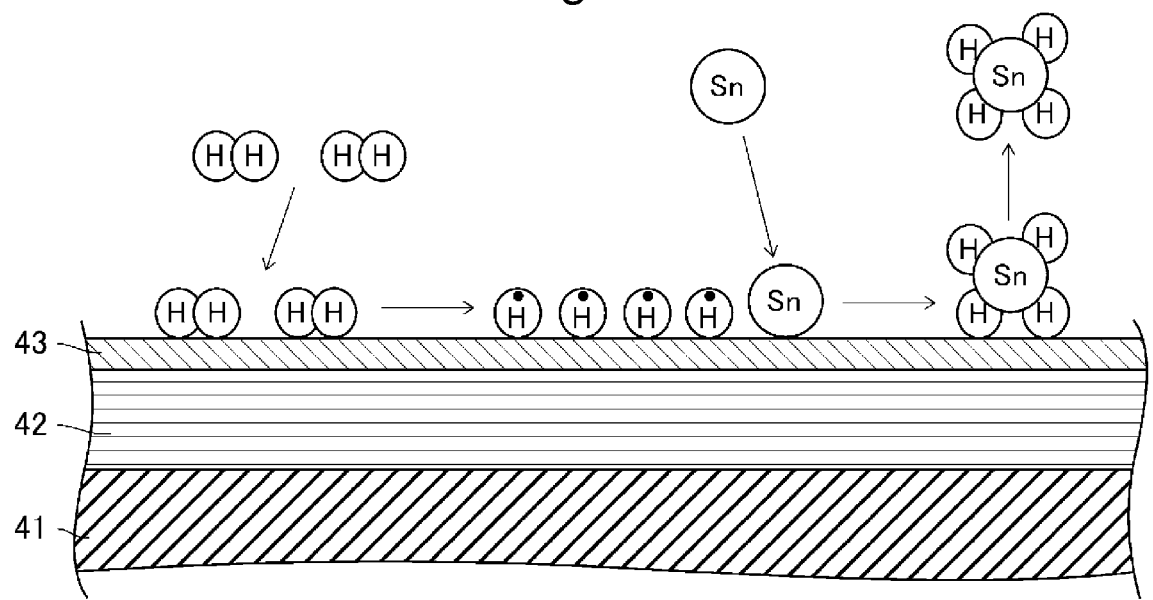
FIG. 3 diagrammatically shows an estimated mechanism of a reaction between a gas supplied to a reflective surface and fine particles adhering to the reflective surface.

Among fine particles generated when a droplet DL is turned into plasma, fine particles moving toward a surface of the capping layer 43 that is a surface 16A of the EUV light reflective mirror 16 react with a gas supplied from a gas supply unit 18 to generate a predetermined product as described above. An estimated mechanism of this reaction is shown in FIG. 3. FIG. 3 shows a case where a material of a target substance is tin and the gas supplied from the gas supply unit 18 contains hydrogen.

As shown in FIG. 3, when the gas supplied from the gas supply unit 18 contains hydrogen molecules, the hydrogen molecules are adsorbed on the surface of the capping layer 43. When the hydrogen molecules are irradiated with light including EUV light, the hydrogen molecules generate hydrogen radicals. The fine particles moving toward the surface 16A of the EUV light reflective mirror 16 react with the hydrogen radicals to generate stannane that is gas at room temperature as expressed by Expression (1) below:

$$\text{Sn} + 4\text{H·} \rightarrow \text{SnH}_4 \qquad (1)$$

Figure 4:
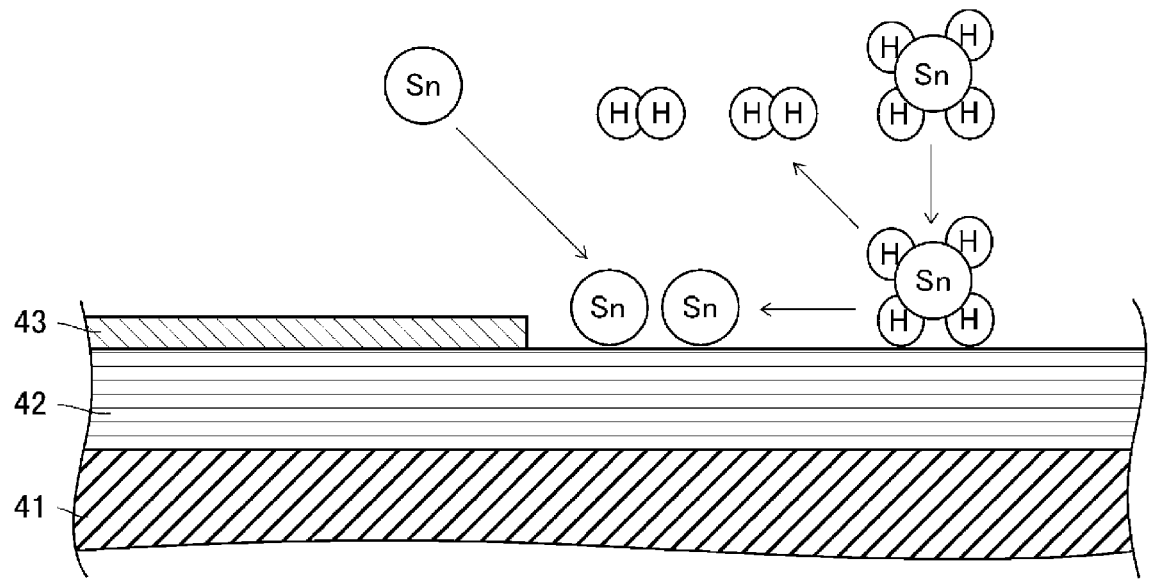
FIG. 4 diagrammatically shows an estimated mechanism of accumulation of fine particles of a target substance.

However, the fine particles may collide with and wear away the capping layer 43 to locally expose the multilayer film 42 from the capping layer 43. In this case, the fine particles easily accumulate on the multilayer film 42. An estimated mechanism of accumulation of the fine particles of the target substance is shown in FIG. 4. Like FIG. 3, FIG. 4 shows a case where the material of the target substance is tin and the gas supplied from the gas supply unit 18 contains hydrogen.

As shown in FIG. 4, when the multilayer film 42 is exposed from the capping layer 43, the stannane is adsorbed on the multilayer film 42. When the stannane is adsorbed, a reverse reaction of Expression (1) occurs, and the hydrogen molecules are released from the stannane to generate tin fine particles, which remain on the multilayer film 42. When the stannane is further adsorbed on the tin fine particles remaining on the multilayer film 42, the reverse reaction of Expression (1) occurs, and further tin fine particles remain on the tin fine particles remaining on the multilayer film 42. In this way, the tin fine particles accumulate on the multilayer film 42. Although such a mechanism is an estimation as described above, an experiment has shown that the fine particles easily accumulate on the multilayer film 42 exposed from the capping layer 43.

In this way, when the fine particles accumulate on the multilayer film 42 exposed from the capping layer 43, the accumulating fine particles may reduce reflectance of the EUV light on the EUV light reflective mirror 16.

Then, embodiments described below illustrate an EUV light reflective mirror 16 that can suppress a reduction in reflectance of EUV light.

4. Description of EUV light reflective mirror of Embodiment 1

Next, a configuration of an EUV light reflective mirror 16 of Embodiment 1 will be described. Components similar to those described above are denoted by the same reference numerals, and overlapping descriptions are omitted unless otherwise stated. A case where a material of a target substance is tin and a gas supplied from a gas supply unit 18 contains hydrogen will be described below as an example.

4.1 Configuration

Figure 5:
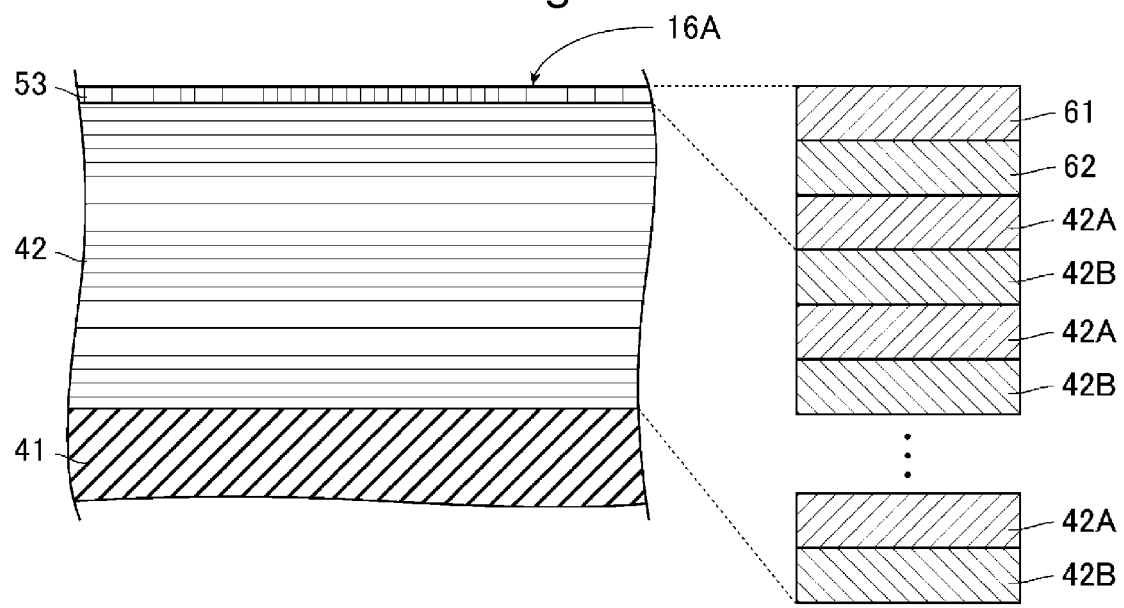
FIG. 5 diagrammatically shows a section of an EUV light reflective mirror of Embodiment 1.

FIG. 5 diagrammatically shows a section of the EUV light reflective mirror 16 of Embodiment 1. As shown in FIG. 5, the EUV light reflective mirror 16 of this embodiment is different from the EUV light reflective mirror 16 of the comparative example in that the former includes a capping layer 53 including a plurality of layers while the latter includes the capping layer 43 including a single layer. The capping layer 53 of this embodiment transmits EUV light, and includes a first layer 61 and a second layer 62.

The first layer 61 contains an oxide of a metal. As long as the first layer 61 mainly contains the oxide of the metal, the first layer 61 may contain, together with the main material, additives, impurities, or the like in a smaller amount than the main material. However, the content of the oxide of the metal in the first layer 61 is preferably 80% or more. The first layer 61 preferably does not contain a nitride or a boride of the metal. The oxide of the metal contained in the first layer 61 may have an amorphous structure or a polycrystalline structure, but preferably has a polycrystalline structure.

The metal that forms the oxide of the metal contained in the first layer 61 may be of any type. However, electronegativity of the metal is preferably lower than electronegativity of tin to promote the reaction in Expression (1). The metal is preferably selected from a group 2 element, a transition metal, or a lanthanoid metal. The group 2 element is preferably selected from Mg, Ca, Sr, or Ba in terms of lower electronegativity than Sn. The transition metal is preferably selected from Sc, Ti, Y, Zr, Nb, Hf, or Ta in terms of lower electronegativity than Sn. The lanthanoid metal is preferably selected from La, Ce, Nd, Eu, Gd, Tb, Er, or Yb in terms of lower electronegativity than Sn. The oxide of the metal is preferably a photocatalyst in terms of promoting the reaction in Expression (1). Also in this case, the oxide of the metal preferably has a polycrystalline structure in terms of promoting the reaction in Expression (1).

When the first layer 61 contains an oxide of the group 2 element, the oxide may include, for example, MgO, CaO, SrO, and BaO. A density of MgO is 3.58 g/cm$^3$. A density of CaO is 3.35 g/cm$^3$. A density of SrO is 4.7 g/cm$^3$. A density of BaO is 5.72 g/cm$^3$. When the first layer 61 contains an oxide of the transition metal, the oxide may include, for example, $Sc_2O_3$, $TiO_2$, $Y_2O_3$, $ZrO_2$, $Nb_2O_5$, $HfO_2$, and $Ta_2O_5$. Densities of these oxides are as described below. Specifically, the density of $Sc_2O_3$ is 3.86 g/cm$^3$. The density of $TiO_2$ is 4.23 g/cm$^3$. The density of $Y_2O_3$ is 5.01 g/cm$^3$. The density of $ZrO_2$ is 5.68 g/cm$^3$. The density of $Nb_2O_5$ is 4.6 g/cm$^3$. The density of $HfO_2$ is 9.68 g/cm$^3$. The density of $Ta_2O_5$ is 8.2 g/cm$^3$. When the first layer 61 contains an oxide of the lanthanoid metal, the oxide may include, for example, $La_2O_3$, $CeO_2$, $Nd_2O_3$, $Eu_2O_3$, $Gd_2O_3$, $Tb_2O_3$, $Er_2O_3$, and $Yb_2O_3$.

Densities of these oxides are as described below. Specifically, the density of $La_2O_3$ is 6.51 g/cm$^3$. The density of $CeO_2$ is 7.22 g/cm$^3$. The density of $Nd_2O_3$ is 7.24 g/cm$^3$. The density of $Eu_2O_3$ is 7.42 g/cm$^3$. The density of $Gd_2O_3$ is 7.41 g/cm$^3$. The density of $Tb_2O_3$ is 7.9 g/cm$^3$. The density of $Er_2O_3$ is 8.64 g/cm$^3$. The density of $Yb_2O_3$ is 9.17 g/cm$^3$.

A thickness of the first layer 61 is preferably, for example, equal to or larger than a thickness of a minimum structural unit of the oxide of the metal contained in the first layer 61 and 3 nm or smaller. Herein, a thickness of a layer is obtained in such a manner that thicknesses at any three or more points of the layer are measured to obtain an arithmetic mean value of the measured thicknesses.

Surface roughness of the first layer 61 that is a surface 16A of the EUV light reflective mirror 16 is, for example, an Ra value of 0.5 nm or lower, and preferably 0.3 nm or lower. Surface roughness may be measured by, for example, a method described in APPLIED OPTICS Vol. 50, No. 9/20 March (2011) C164-C171.

The second layer 62 is arranged between the first layer 61 and the multilayer film 42, and contains at least one of a boride and a nitride of the metal that forms the oxide of the metal contained in the first layer 61. In the example in FIG. 5, the second layer 62 is arranged in contact with the first layer 61. However, a different layer may be provided between the first layer 61 and the multilayer film 42. As long as the second layer 62 mainly contains at least one of the boride and the nitride of the metal that forms the oxide of the metal contained in the first layer 61, the second layer 62 may contain, together with the main material, additives, impurities, or the like in a smaller amount than the main material. The compound contained in the second layer 62 may have an amorphous structure or a polycrystalline structure, but preferably has a polycrystalline structure.

When the oxide of the metal contained in the first layer 61 is the oxide of the group 2 element, a boride of the group 2 element contained in the second layer 62a may include, for example, $MgB_2$, $CaB_6$, $SrB_6$, and $BaB_6$. When the oxide of the metal contained in the first layer 61 is the oxide of the transition metal, a boride of the transition metal contained in the second layer 62 may include, for example, $ScB_{12}$, $TiB_2$, $YB_6$, $ZrB_2$, $NbB_2$, $HfB_2$, and TaB. When the oxide of the metal contained in the first layer 61 is the oxide of the transition metal, a nitride of the transition metal contained in the second layer 62 may include, for example, ScN, TiN, YN, ZrN, NbN, HfN, and TaN. When the oxide of the metal contained in the first layer 61 is the oxide of the lanthanoid metal, a boride of the lanthanoid metal contained in the second layer 62 may include, for example, $LaB_6$, $CeB_6$, $EuB_6$, $GdB_6$, $TbB_6$, $NdB_6$, $ErB_6$, and $YbB_6$. When the oxide of the metal contained in the first layer 61 is the oxide of the lanthanoid metal, a nitride of the lanthanoid metal contained in the second layer 62 may include, for example, LaN, CeN, EuN, GdN, TbN, NdN, ErN, and YbN.

In terms of suppressing the capping layer 43 from being worn away due to collision with tin fine particles as described above, the capping layer 43 is preferably as thick as possible. However, transmittance of the EUV light tends to decrease with increasing thickness of the capping layer 43, thereby reducing an amount of the EUV light reflected by the multilayer film 42. Further, in terms of promoting the reaction in Expression (1), the capping layer 53 preferably includes the first layer containing the oxide of the metal. Thus, it is preferable that the capping layer 53 includes the first layer containing the oxide of the metal, is as thick as possible, and also has high transmittance of the EUV light. Thus, when transmittance of the EUV light through the second layer 62 is higher than transmittance of the EUV light through the first layer 61, the capping layer 53 can be as thick as possible and also have high transmittance of the EUV light as compared to when the capping layer 53 does not include the second layer 62.

Figure 6:
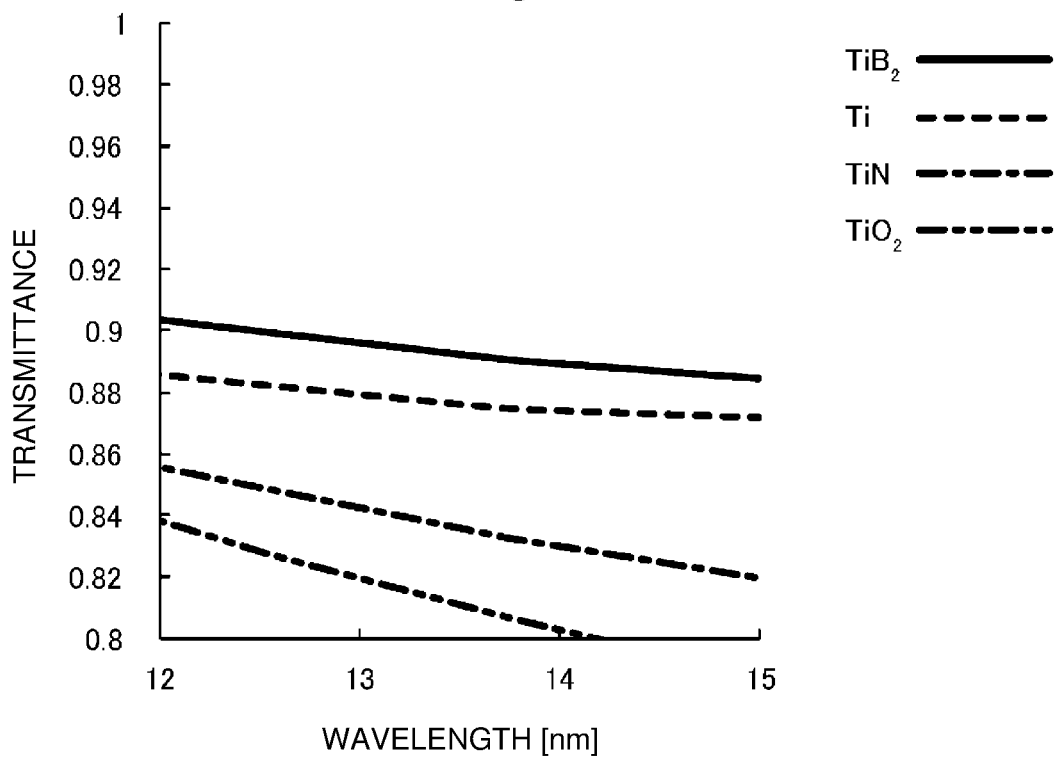
FIG. 6 is a graph showing transmittances of EUV light through Ti and compounds of Ti and non-metals.

FIG. 6 shows transmittances of the EUV light through Ti, an oxide of Ti, a nitride of Ti, and a boride of Ti. As shown in FIG. 6, $TiB_2$, Ti, TiN, and $TiO_2$ in this order have higher transmittance of the EUV light. Thus, when the first layer 61 contains $TiO_2$ and the second layer 62 contains at least one of $TiB_2$ and TiN, the transmittance of the EUV light through the capping layer 53 can be higher than when both the first layer 61 and the second layer 62 contain $TiO_2$.

Figure 7:
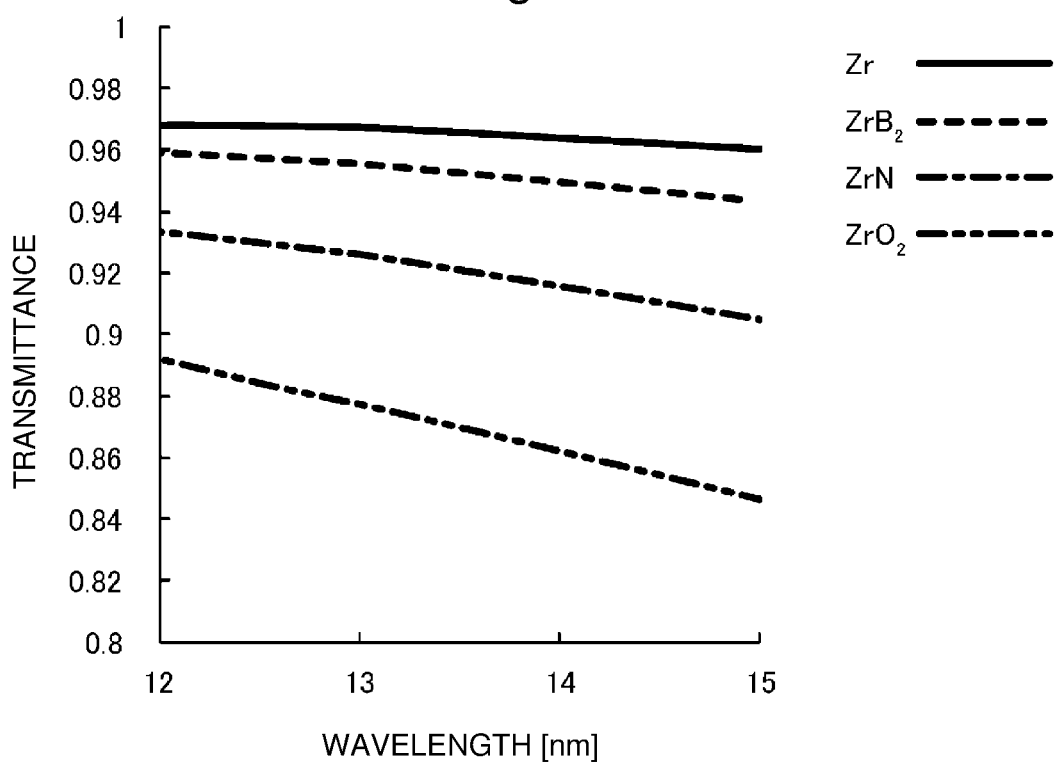
FIG. 7 is a graph showing transmittances of the EUV light through Zr and compounds of Zr and non-metals.

FIG. 7 shows transmittances of the EUV light through Zr, an oxide of Zr, a nitride of Zr, and a boride of Zr. As shown in FIG. 7, Zr, $ZrB_2$, ZrN, and $ZrO_2$ in this order have higher transmittance of the EUV light. Thus, when the first layer 61 contains $ZrO_2$ and the second layer 62 contains at least one of $ZrB_2$ and ZrN, the transmittance of the EUV light through the capping layer 53 can be higher than when both the first layer 61 and the second layer 62 contain $ZrO_2$.

Figure 8:
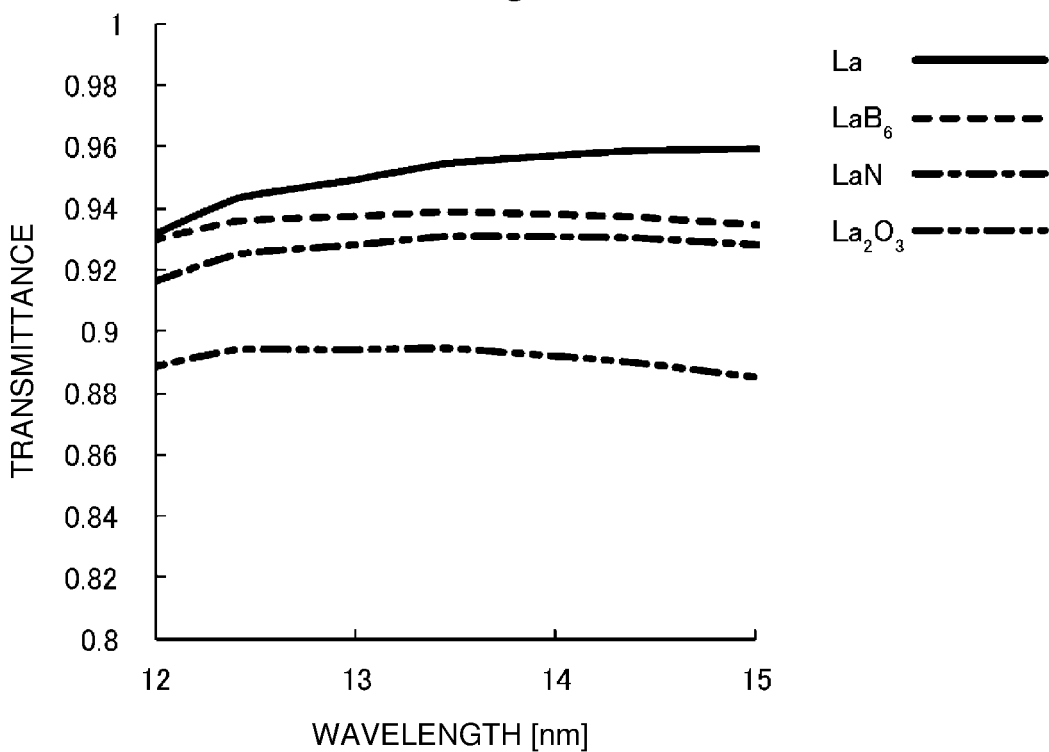
FIG. 8 is a graph showing transmittances of the EUV light through La and compounds of La and non-metals.

FIG. 8 shows transmittances of the EUV light through La, an oxide of La, a nitride of La, and a boride of La. As shown in FIG. 8, La, $LaB_6$, LaN, and $La_2O_3$ in this order have higher transmittance of the EUV light. Thus, when the first layer 61 contains $La_2O_3$ and the second layer 62 contains at least one of $LaB_6$ and LaN, the transmittance of the EUV light through the capping layer 53 can be higher than when both the first layer 61 and the second layer 62 contain $La_2O_3$.

Figure 9:
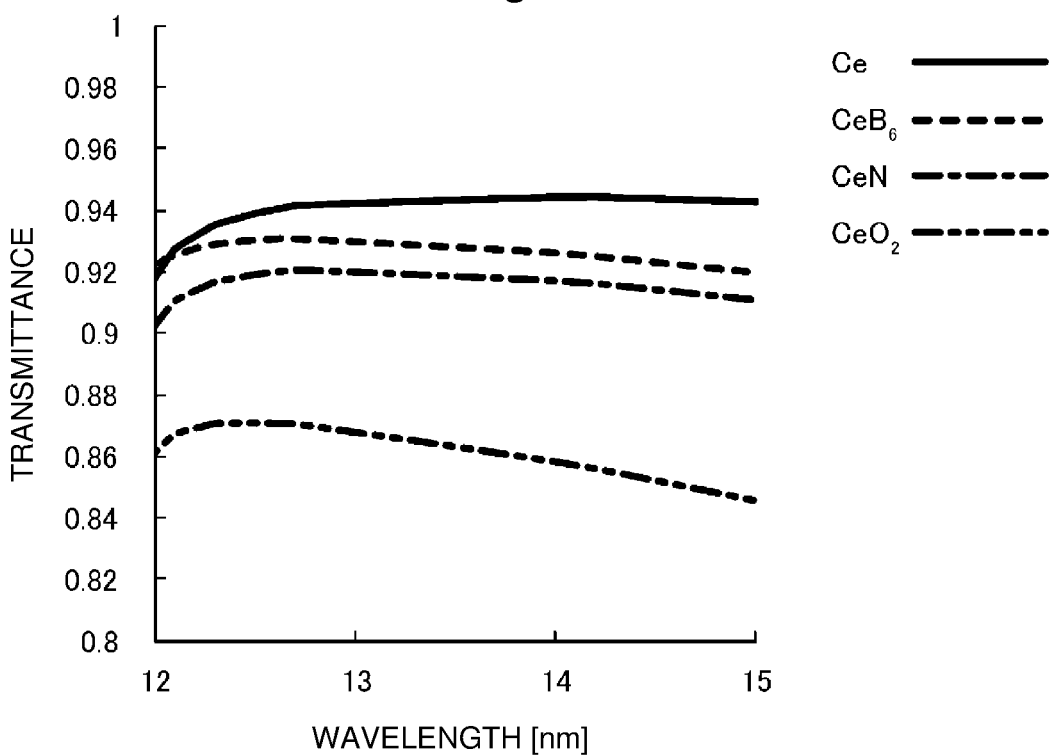
FIG. 9 is a graph showing transmittances of the EUV light through Ce and compounds of Ce and non-metals.

FIG. 9 shows transmittances of the EUV light through Ce, an oxide of Ce, a nitride of Ce, and a boride of Ce. As shown in FIG. 9, Ce, $CeB_6$, CeN, and $CeO_2$ in this order have higher transmittance of the EUV light. Thus, when the first layer 61 contains $CeO_2$ and the second layer 62 contains at least one of $CeB_6$ and CeN, the transmittance of the EUV light through the capping layer 53 can be higher than when both the first layer 61 and the second layer 62 contain $CeO_2$.

Figure 10:
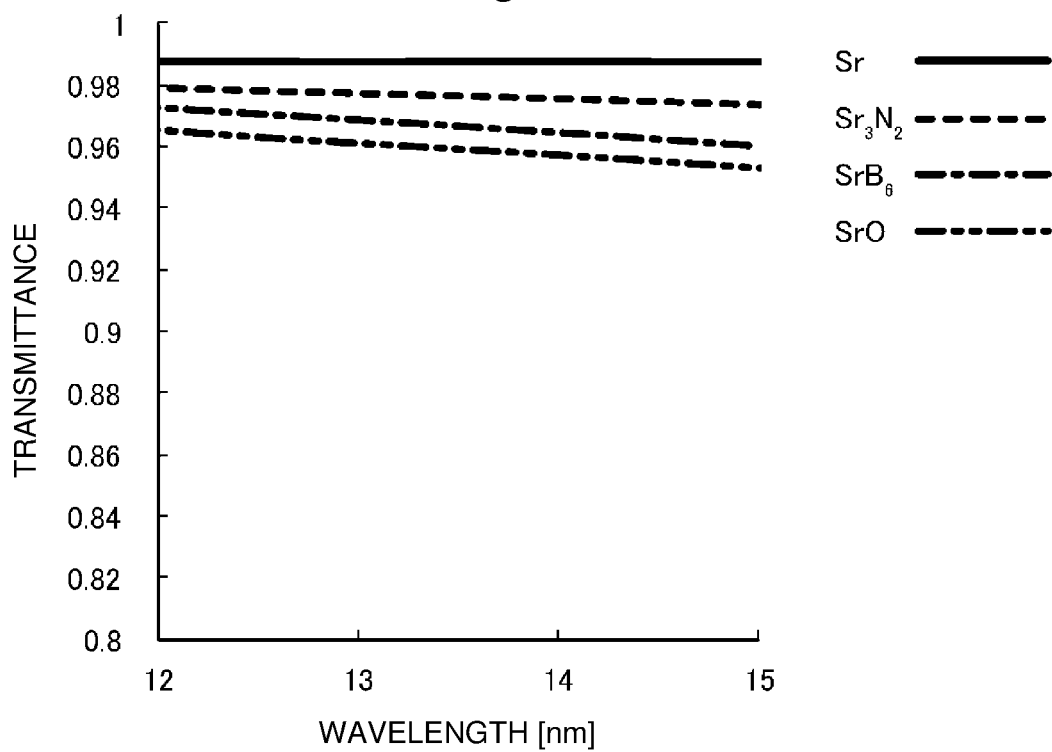
FIG. 10 is a graph showing transmittances of the EUV light through Sr and compounds of Sr and non-metals.

FIG. 10 shows transmittances of the EUV light through Sr, an oxide of Sr, a nitride of Sr, and a boride of Sr. As shown in FIG. 10, Sr, $Sr_3N_2$, $SrB_6$, and SrO in this order have higher transmittance of the EUV light. Thus, when the first layer 61 contains SrO and the second layer 62 contains at least one of $Sr_3N_2$ and $SrB_6$, the transmittance of the EUV light through the capping layer 53 can be higher than when both the first layer 61 and the second layer 62 contain SrO.

Figure 11:
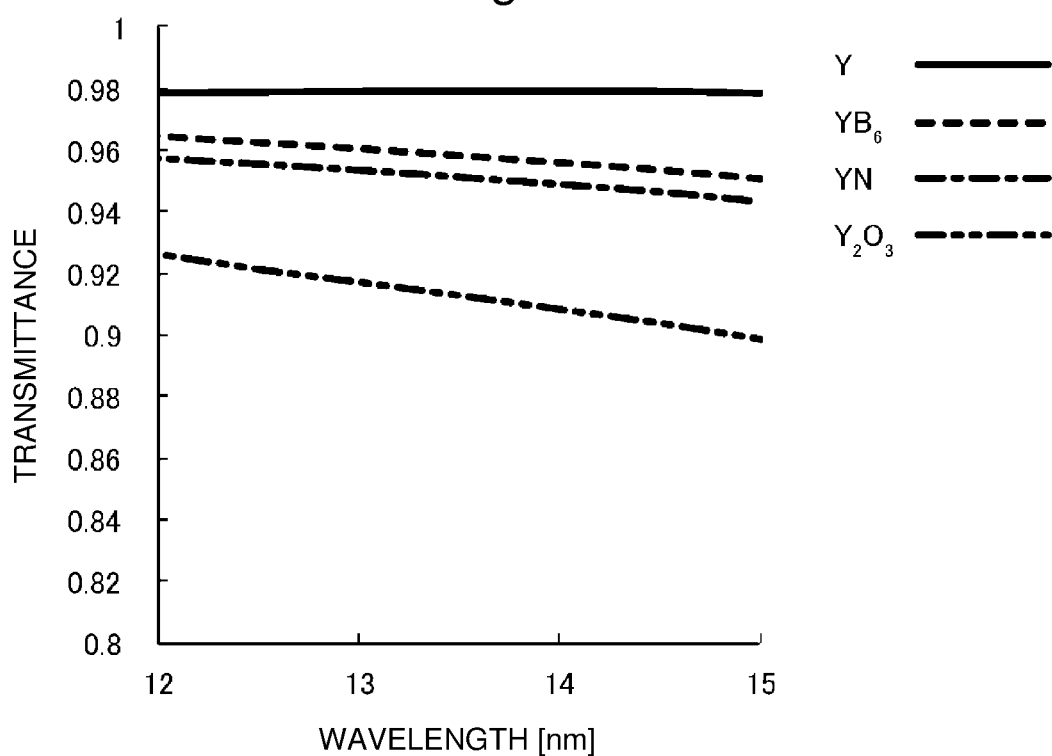
FIG. 11 is a graph showing transmittances of the EUV light through Y and compounds of Y and non-metals.

FIG. 11 shows transmittances of the EUV light through Y, an oxide of Y, a nitride of Y, and a boride of Y. As shown in FIG. 11, Y, $YB_6$, YN, and $Y_2O_3$ in this order have higher transmittance of the EUV light. Thus, when the first layer 61 contains $Y_2O_3$ and the second layer 62 contains at least one of $YB_6$ and YN, the transmittance of the EUV light through the capping layer 53 can be higher than when both the first layer 61 and the second layer 62 contain $Y_2O_3$.

The transmittances described in FIGS. 6 to 11 are based on a calculation with reference to a database of X-ray transmittance by The CENTER FOR X-RAY OPTICS (CXRO) assuming a film thickness of 10 nm.

Figure 12:
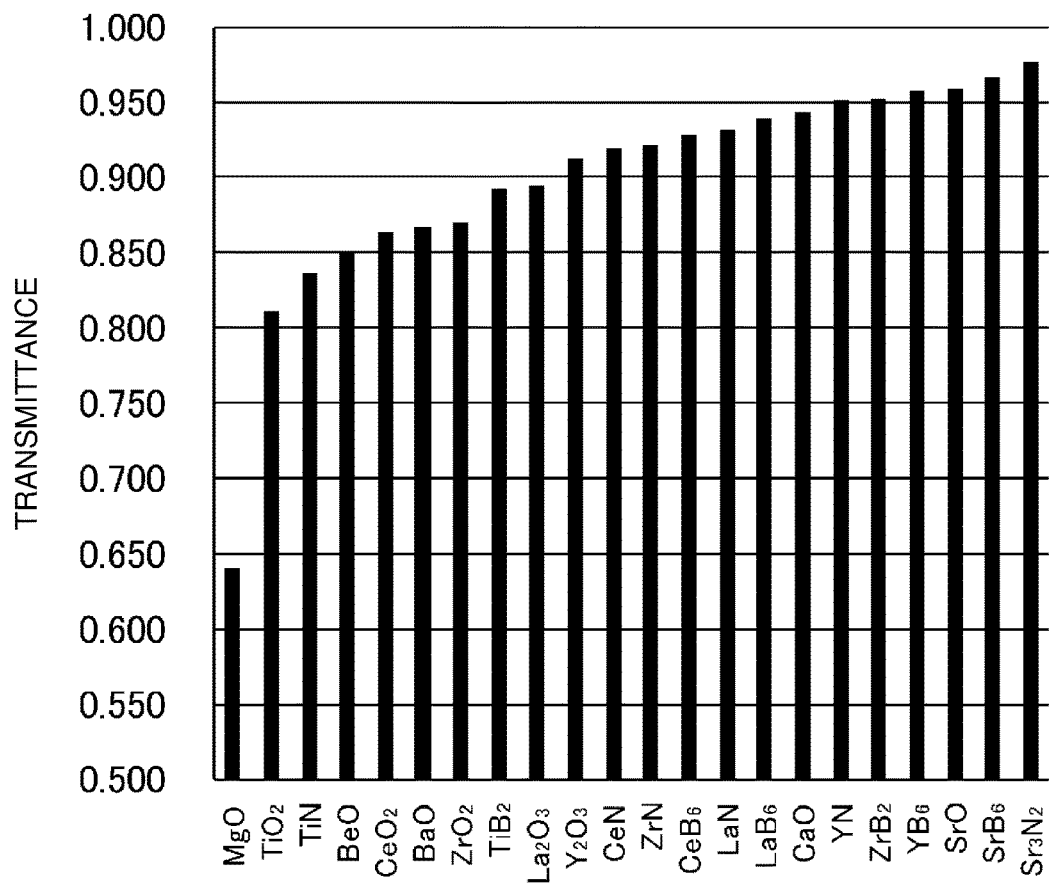
FIG. 12 is a graph showing transmittances of the EUV light through compounds of metals and the non-metals.

FIG. 12 shows transmittances of the EUV light through the oxides, the nitrides, and the borides of the metals. The transmittances are based on a calculation with reference to the database of X-ray transmittance by CXRO at a wavelength of 13.5 nm assuming a film thickness of 10 nm. FIG. 12 also shows transmittances of the EUV light through MgO, BeO, BaO, and CaO. As shown in FIG. 12, generally, the compounds of Sr, the compounds of Y, the compounds of Zr, the compounds of La, the compounds of Ce, and the compounds of Ti in this order tend to have higher transmittance of the EUV light. As is apparent from FIGS. 6 to 12, for the same type of metal, the nitride and the boride of the metal tend to have higher transmittance of the EUV light than the oxide of the metal. For the same type of metal, generally, the boride of the metal tends to have higher transmittance of the EUV light than the nitride of the metal.

A thickness of the second layer 62 is preferably, for example, equal to or larger than a thickness of a minimum structural unit of the compound contained in the second layer 62 and 10 nm or smaller. The thickness of the second layer 62 is preferably larger than the thickness of the first layer 61 in terms of suppressing a reduction in transmittance of the EUV light and suppressing the tin fine particles from reaching the multilayer film 42. As described above, for the same type of metal, the nitride and the boride of the metal tend to have higher transmittance of the EUV light than the oxide of the metal. Thus, even if the thickness of the second layer 62 is larger than the thickness of the first layer 61, the transmittance of the EUV light through the second layer 62 can be higher than the transmittance of the EUV light through the first layer 61.

Such an EUV light reflective mirror 16 can be produced by, for example, repeating a deposition step several times to deposit the multilayer film 42, the second layer 62, and the first layer 61 in this order on a substrate 41. A depositing device may include, for example, a sputtering device, an atomic layer accumulating device, or the like. When the first layer 61 is deposited and then the deposited first layer 61 is annealed, the material of the first layer 61 is easily polycrystallized. Thus, the first layer 61 is preferably deposited and then annealed. When the material contained in the second layer 62 is to be polycrystallized, the second layer 62 is preferably deposited and then annealed like the first layer 61. The annealing may include laser annealing, and a laser beam used for the laser annealing may include, for example, a KrF laser beam, a XeCl laser beam, a XeF laser beam, or the like. A fluence of the laser beam is, for example, 300 to 500 $mJ/cm^2$, and a pulse width of the laser beam is, for example, 20 to 150 ns.

4.2 Effect

As described above, the hydrogen molecules contained in the gas supplied from the gas supply unit 18 are adsorbed on the surface 16A of the EUV light reflective mirror 16. When the hydrogen molecules are irradiated with light including the EUV light, the hydrogen molecules generate hydrogen radicals. The tin fine particles moving toward the surface 16A of the EUV light reflective mirror 16 react with the hydrogen radicals to generate stannane that is gas at room temperature.

In the EUV light reflective mirror 16 of this embodiment, the first layer 61 on an outermost side of the surface 16A contains the oxide of the metal. This promotes a substitution reaction in Expression (1) for substituting the tin fine particles moving toward the surface 16A of the EUV light reflective mirror 16 with stannane to easily generate stannane. Thus, the EUV light reflective mirror 16 of this embodiment can suppress accumulation of the tin fine particles moving toward the surface 16A.

Part of the tin fine particles moving toward the surface 16A of the EUV light reflective mirror 16 may collide with the first layer 61 and wear away the first layer 61. This may locally expose the second layer 62 from the first layer 61. The second layer 62 contains at least one of the boride and the nitride of the metal that forms the oxide of the metal contained in the first layer 61 as described above. Thus, even if the second layer 62 is locally exposed from the first layer 61, the boride or the nitride of the metal is oxidized at the exposed part to generate the oxide of the metal. Thus, also at the locally exposed part of the second layer 62 from the first layer 61, the substitution reaction in Expression (1) is promoted to easily generate stannane as described above. Thus, even if at least part of the first layer 61 is worn away to expose the second layer 62, the EUV light reflective mirror 16 of this embodiment can suppress accumulation of the tin fine particles at the exposed part.

As described above, for the same type of metal, the nitride and the boride of the metal tend to have higher transmittance of the EUV light than the oxide of the metal. Thus, the transmittance of the EUV light through the capping layer 53 can be higher than when both the first layer 61 and the second layer 62 contain the oxide of the metal.

As such, in the EUV light reflective mirror 16 of this embodiment, the substitution reaction of the tin fine particles with stannane can be promoted in the first layer 61 on the side of the surface 16A, and even if the first layer 61 is worn away to expose the second layer 62, the substitution reaction of the tin fine particles with stannane can be promoted in the exposed second layer 62. Thus, the EUV light reflective mirror 16 of this embodiment can increase life of the capping layer 43 and also suppress accumulation of the tin fine particles. In this way, the EUV light reflective mirror 16 that can suppress a reduction in reflectance of the EUV light can be achieved.

As described above, even if the thickness of the second layer 62 is larger than the thickness of the first layer 61, the transmittance of the EUV light through the first layer 61 can be higher than the transmittance of the EUV light through the second layer 62. This can suppress a reduction in transmittance of the entire EUV light reflective mirror 16, and also increase the thickness of the capping layer 53.

When electronegativity of the metal that forms the oxide of the metal contained in the first layer 61 is lower than electronegativity of tin that is a target substance of a laser beam L used for generating the EUV light, the tin fine particles generated when a droplet is turned into plasma tend to be easily substituted with stannane. This can further suppress accumulation of the tin fine particles. As described above, the example has been described in which the target substance of the laser beam L used for generating the EUV light is tin, but the target substance is not limited to tin as described above.

5. Description of EUV Light Reflective Mirror of Embodiment 2

Next, a configuration of an EUV light reflective mirror 16 of Embodiment 2 will be described. Components similar to those described above are denoted by the same reference numerals, and overlapping descriptions are omitted unless otherwise stated.

5.1 Configuration

Figure 13:
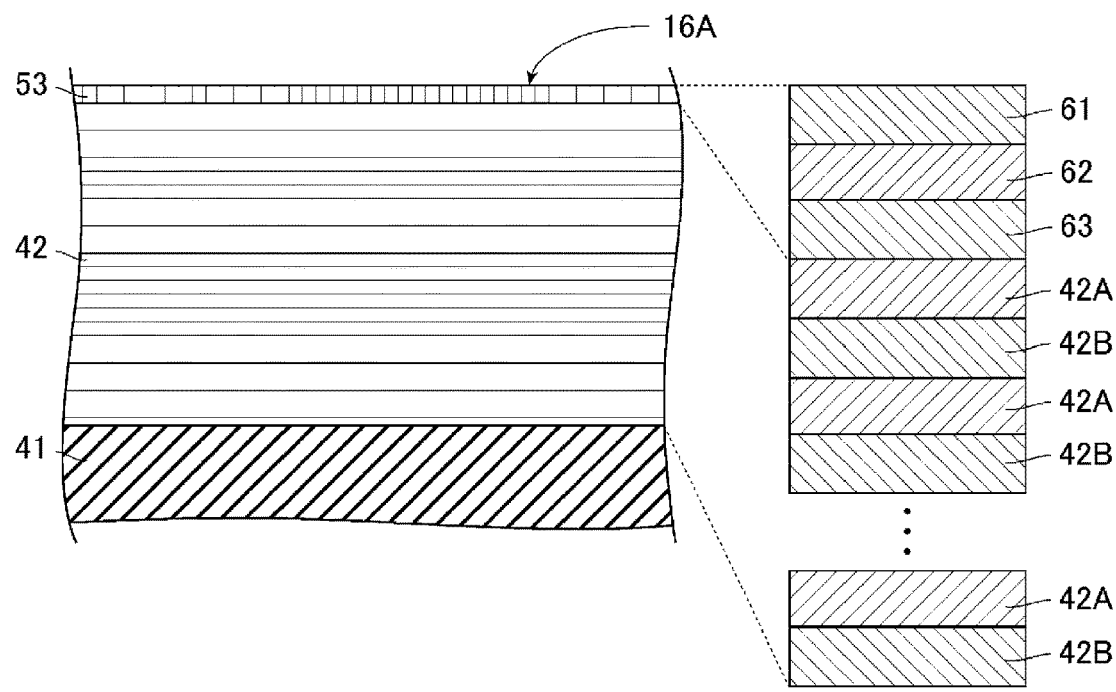
FIG. 13 diagrammatically shows a section of an EUV light reflective mirror of Embodiment 2.

FIG. 13 diagrammatically shows a section of an EUV light reflective mirror 16 of Embodiment 2. As shown in FIG. 13, the EUV light reflective mirror 16 of this embodiment is different from the EUV light reflective mirror 16 of Embodiment 1 in that a capping layer 53 includes a third layer 63.

The third layer 63 is arranged between a second layer 62 and a multilayer film 42. In the example in FIG. 13, the third layer 63 is arranged in contact with the second layer 62, but a different layer may be provided between the third layer 63 and the second layer 62. In the example in FIG. 13, the third layer 63 is arranged in contact with the multilayer film 42, but a different layer may be provided between the third layer 63 and the multilayer film 42.

A density of the third layer 63 is higher than a density of the second layer 62. Transmittance of EUV light through the third layer 63 is preferably higher than transmittance of the EUV light through a first layer 61. The third layer 63 preferably transmits 80% of the EUV light entering the third layer 63. A material of the third layer 63 is not particularly limited as long as the density of the third layer 63 is higher than the density of the second layer 62. However, the third layer 63 preferably contains a metal different from a metal contained in the first layer 61, and preferably contains at least one of an oxide, a nitride, and a boride of the different metal.

The different metal contained in the third layer 63 is preferably selected from a group 2 element, a transition metal, or a lanthanoid metal. When the different metal contained in the third layer 63 is the group 2 element, the different metal is preferably selected from Sr or Ba. A density of Sr is 2.64 g/cm$^3$. A density of Ba is 3.51 g/cm$^3$. When the different metal contained in the third layer 63 is the transition metal, the different metal is preferably selected from Sc, Ti, Y, Zr, Nb, Hf, Ta, W, Re, Os, Ir, or Pt. Densities of these oxides are as described below. Specifically, the density of Sc is 2.985 g/cm$^3$. The density of Ti is 4.506 g/cm$^3$. The density of Y is 4.472 g/cm$^3$. The density of Zr is 6.52 g/cm$^3$. The density of Nb is 8.57 g/cm$^3$. The density of Hf is 13.31 g/cm$^3$. The density of Ta is 16.69 g/cm$^3$. The density of W is 19.25 g/cm$^3$. The density of Re is 21.02 g/cm$^3$. The density of Os is 22.59 g/cm$^3$. The density of Ir is 22.56 g/cm$^3$. The density of Pt is 21.45 g/cm$^3$. When the different metal contained in the third layer 63 is the lanthanoid metal, the different metal is preferably selected from La, Ce, Pr, Nd, Pm, Sm, Eu, Gd, Tb, Dy, Ho, Er, Tm, Yb, or Lu. Densities of these oxides are as described below. Specifically, the density of La is 6.162 g/cm$^3$. The density of Ce is 6.770 g/cm$^3$. The density of Pr is 6.77 g/cm$^3$. The density of Nd is 7.01 g/cm$^3$. The density of Pm is 7.26 g/cm$^3$. The density of Sm is 7.52 g/cm$^3$. The density of Eu is 5.264 g/cm$^3$. The density of Gd is 7.90 g/cm$^3$. The density of Tb is 8.23 g/cm$^3$. The density of Dy is 8.540 g/cm$^3$. The density of Ho is 8.79 g/cm$^3$. The density of Er is 9.066 g/cm$^3$. The density of Tm is 9.32 g/cm$^3$. The density of Yb is 6.90 g/cm$^3$. The density of Lu is 9.84 g/cm$^3$.

When the third layer 63 contains the oxide of the different metal, and the oxide is an oxide of the group 2 element, the oxide may include, for example, MgO, CaO, SrO, and BaO. Densities of these oxides are as described for the oxides contained in the first layer 61. When the oxide of the different metal contained in the third layer 63 is an oxide of the transition element, the oxide may include, for example, $Sc_2O_3$, $TiO_2$, $Y_2O_3$, $ZrO_2$, $Nb_2O_5$, $HfO_2$, $Ta_2O_5$, $WO_2$, $ReO_3$, $OsO_4$, and $IrO_2$. Densities of these oxides are as described for the oxides contained in the first layer 61. A density of $WO_2$ is 10.98 g/cm$^3$. A density of $ReO_3$ is 6.92 g/cm$^3$. A density of $OsO_4$ is 4.91 g/cm$^3$. A density of $IrO_2$ is 11.66 g/cm$^3$. When the oxide of the different metal contained in the third layer 63 is an oxide of the lanthanoid metal, the oxide may include, for example, $La_2O_3$, $CeO_2$, $PrO_2$, $Nd_2O_3$, $Pm_2O_3$, $Sm2O3$, $Eu_2O_3$, $Gd_2O_3$, $Tb_2O_3$, $DY_2O_3$, $Ho_2O_3$, $Er_2O_3$, $TmO_3$, $Yb_2O_3$, and $Lu_2O_3$. Densities of these oxides are as described for the oxides contained in the first layer 61. A density of $PrO_2$ is 6.9 g/cm$^3$. A density of $Pm_2O_3$ is 6.85 g/cm$^3$. A density of $Sm_2O_3$ is 8.35 g/cm$^3$. A density of $DY_2O_3$ is 7.8 g/cm$^3$. A density of $Ho_2O_3$ is 8.41 g/cm$^3$. A density of $TmO_3$ is 8.6 g/cm$^3$. A density of $Lu_2O_3$ is 9.42 g/cm$^3$.

When the third layer 63 contains the boride of the different metal, and the boride is a boride of the group 2 element, the boride may include, for example, $MgB_2$, $CaB_6$, $SrB_6$, and $BaB_6$. A density of $MgB_2$ is 2.57 g/cm$^3$. A density of $CaB_6$ is 2.45 g/cm$^3$. A density of $SrB_6$ is 3.39 g/cm$^3$. A density of $BaB_6$ is 4.36 g/cm$^3$. When the boride of the different metal contained in the third layer 63 is a boride of the transition element, the boride may include, for example, $ScB_{12}$, $TiB_2$, $YB_6$, $ZrB_2$, $NbB_2$, $HfB_2$, $TaB$, $WB$, and $ReB_2$. A density of $TiB_2$ is 4.52 g/cm$^3$. A density of $YB_6$ is 3.67 g/cm$^3$. A density of $ZrB_2$ is 6.08 g/cm$^3$. A density of $NbB_2$ is 6.97 g/cm$^3$. A density of $HfB_2$ is 10.5 g/cm$^3$. A density of $TaB$ is 14.2 g/cm$^3$. A density of $WB$ is 15.3 g/cm$^3$. A density of $ReB_2$ is 12.7 g/cm$^3$. When the boride of the different metal contained in the third layer 63 is a boride of the lanthanoid metal, the boride may include, for example, $LaB_6$, $CeB_6$, $EuB_6$, $GdB_6$, $TbB_6$, $NdB_6$, $SmB_6$, $ErB_6$, and $YbB_6$. A density of $LaB_6$ is 2.61 g/cm$^3$. A density of $CeB_6$ is 4.8 g/cm$^3$. A density of $NdB_6$ is 4.93 g/cm$^3$. A density of $SmB_6$ is 5.07 g/cm$^3$.

When the third layer 63 contains the nitride of the different metal, and the nitride is a nitride of the group 2 element, the nitride may include, for example, $Mg_3N_2$, $Ca_3N_2$, $Sr_3N_2$, and $Ba_3N_2$. A density of $Mg_3N_2$ is 2.71 g/cm$^3$. A density of $Ca_3N_2$ is 2.67 g/cm$^3$. When the nitride of the different metal contained in the third layer 63 is a nitride of the transition element, the nitride may include, for example, ScN, TiN, YN, ZrN, NbN, HfN, TaN, and WN. A density of TiN is 5.4 g/cm$^3$. A density of YN is 5.6 g/cm$^3$. A density of ZrN is 7.09 g/cm$^3$. A density of NbN is 8.47 g/cm$^3$. A density of HfN is 13.8 g/cm$^3$. A density of TaN is 13.7 g/cm$^3$. A density of WN is 5.0 g/cm$^3$. When the nitride of the different metal contained in the third layer 63 is a nitride of the lanthanoid metal, the nitride may include, for example, LaN, CeN, EuN, GdN, TbN, NdN, SmN, ErN, TmN, and YbN. A density of SmN is 7.353 g/cm$^3$. A density of TmN is 9.321 g/cm$^3$. A density of YbN is 6.57 g/cm$^3$.

When the third layer 63 contains a simple substance of the different metal, a thickness of the third layer 63 is preferably equal to or larger than an atomic diameter of the metal and 5 nm or smaller. When the third layer 63 contains a compound such as the oxide, the nitride, or the boride of the different metal, the thickness of the third layer 63 is preferably equal to or larger than a thickness of a minimum structural unit of the compound and 5 nm or smaller. The thickness of the third layer 63 is preferably larger than the thickness of the first layer 61, and the thickness of the third layer 63 is preferably smaller than the thickness of the second layer 62 in terms of suppressing a reduction in transmittance of the EUV light and suppressing tin fine particles or the like from reaching the multilayer film 42.

Like the EUV light reflective mirror 16 of Embodiment 1, the EUV light reflective mirror 16 of this embodiment can be produced by, for example, repeating a deposition step several times using a depositing device such as a sputtering device or an atomic layer accumulating device.

5.2 Effect

As described above, hydrogen molecules contained in a gas supplied from a gas supply unit 18 are adsorbed on a surface 16A of the EUV light reflective mirror 16. The hydrogen molecules are irradiated with light including the EUV light to generate hydrogen radicals. Tin fine particles moving toward the surface 16A of the EUV light reflective mirror 16 react with the hydrogen radicals to generate stannane that is gas at room temperature.

The hydrogen radicals may pass through the first layer 61 and the second layer 62 to reach the third layer 63 due to collision with the tin fine particles moving toward the EUV light reflective mirror 16, or the like. Also, part of the tin fine particles moving toward the surface 16A of the EUV light reflective mirror 16 may pass through the first layer 61 and the second layer 62 to reach the third layer 63. However, the density of the third layer 63 of this embodiment is higher than the density of the second layer 62. Thus, even if the tin fine particles or the hydrogen radicals reach the third layer 63, the third layer 63 serves as a barrier to hold the tin fine particles or the hydrogen radicals on a surface of the third layer 63 or inside the third layer 63. Thus, the EUV light reflective mirror 16 of this embodiment can suppress occurrence of blister on an interface of the multilayer film 42.

When the transmittance of the EUV light through the third layer 63 is higher than the transmittance of the EUV light through the first layer 61, a reduction in transmittance of the EUV light can be suppressed, and also the tin fine particles or the hydrogen radicals can be suppressed from reaching the multilayer film 42.

The above descriptions are intended to be illustrative only and not restrictive. Thus, it will be apparent to those skilled in the art that modifications may be made in the embodiments or variants of the present disclosure without departing from the scope of the appended claims.

The terms used throughout the specification and the appended claims should be interpreted as "non-limiting." For example, the term "comprising" or "comprised" should be interpreted as "not limited to what has been described as being comprised." The term "having" should be interpreted as "not limited to what has been described as having." Further, the modifier "a/an" described in the specification and the appended claims should be interpreted to mean "at least one" or "one or more."

What is claimed is:

1. A mirror for extreme ultraviolet light comprising:
a substrate;
a multilayer film provided on the substrate and configured to reflect extreme ultraviolet light; and
a capping layer provided on the multilayer film,
the capping layer including
a first layer containing an oxide of a metal, the first layer being located on an outermost side of the capping layer,
a second layer consisting of a single layer arranged between the first layer and the multilayer film and containing at least one of a boride of the metal and a nitride of the metal, the second layer being in close contact with the first layer, and
a thickness of the second layer is larger than a thickness of the first layer.

2. The mirror for extreme ultraviolet light according to claim 1, wherein the metal is selected from a group 2 element, a transition metal, or a lanthanoid metal.

3. The mirror for extreme ultraviolet light according to claim 1, wherein electronegativity of the metal is lower than electronegativity of a target substance of a laser beam used for generating the extreme ultraviolet light.

4. The mirror for extreme ultraviolet light according to claim 1, wherein transmittance of the extreme ultraviolet light through the second layer is higher than transmittance of the extreme ultraviolet light through the first layer.

5. The mirror for extreme ultraviolet light according to claim 1, wherein a thickness of the first layer is equal to or larger than a thickness of a minimum structural unit of the oxide contained in the first layer and 3 nm or smaller.

6. The mirror for extreme ultraviolet light according to claim 1, wherein a thickness of the second layer is equal to or larger than a thickness of a minimum structural unit of at least one of the boride of the metal and the nitride of the metal contained in the second layer and 10 nm or smaller.

7. The mirror for extreme ultraviolet light according to claim 1, wherein the oxide contained in the first layer has a polycrystalline structure.

8. The mirror for extreme ultraviolet light according to claim 1, further comprising
a third layer arranged between the second layer and the multilayer film,
a density of the third layer being higher than a density of the second layer.

9. The mirror for extreme ultraviolet light according to claim 8, wherein transmittance of the extreme ultraviolet light through the third layer is higher than transmittance of the extreme ultraviolet light through the first layer.

10. The mirror for extreme ultraviolet light according to claim 8, wherein the third layer contains at least one of a metal different from the metal, an oxide of the different metal, a nitride of the different metal, and a boride of the different metal.

11. The mirror for extreme ultraviolet light according to claim 10, wherein the different metal is any of a group 2 element, a transition metal, and a lanthanoid metal.

12. The mirror for extreme ultraviolet light according to claim 10, wherein
the third layer contains a simple substance of the different metal, and
a thickness of the third layer is equal to or larger than an atomic diameter of the different metal contained in the third layer and 5 nm or smaller.

13. The mirror for extreme ultraviolet light according to claim 10, wherein
the third layer contains at least one of an oxide of the different metal, a nitride of the different metal, and a boride of the different metal, and
a thickness of the third layer is equal to or larger than a thickness of a minimum structural unit of at least one of the oxide of the different metal, the nitride of the different metal, and the boride of the different metal contained in the third layer and 5 nm or smaller.

14. The mirror for extreme ultraviolet light according to claim 8, wherein a thickness of the third layer is larger than a thickness of the first layer.

15. The mirror for extreme ultraviolet light according to claim 8, wherein a thickness of the third layer is smaller than a thickness of the second layer.

16. An extreme ultraviolet light generating apparatus comprising:
a chamber;
a droplet discharge unit configured to discharge a droplet of a target substance into the chamber; and
a mirror for extreme ultraviolet light provided in the chamber,
the mirror for extreme ultraviolet light including a substrate, a multilayer film provided on the substrate and configured to reflect extreme ultraviolet light, and a capping layer provided on the multilayer film,
the capping layer including a first layer containing an oxide of a metal, the first layer being located on an outermost side of the capping layer, and a second layer consisting of a single layer arranged between the first layer and the multilayer film and containing at least one of a boride of the metal and a nitride of the metal, the second layer being in close contact with the first layer, and
a thickness of the second layer is larger than a thickness of the first layer.

17. The extreme ultraviolet light generating apparatus according to claim 16, wherein electronegativity of the metal is lower than electronegativity of the target substance.

18. The extreme ultraviolet light generating apparatus according to claim 16, further comprising
a third layer arranged between the second layer and the multilayer film,
a density of the third layer being higher than a density of the second layer.

* * * * *